(12) United States Patent
Patel et al.

(45) Date of Patent: Aug. 16, 2005
(10) Patent No.: US 6,929,831 B2

(54) METHODS OF FORMING NITRIDE FILMS

(75) Inventors: Jashu Patel, Yaton (GB); Knut Beekman, Weston-in-Gordano (GB)

(73) Assignee: Trikon Holdings Limited, Newport (GB)

(*) Notice: Subject to any disclaimer, the term of this patent is extended or adjusted under 35 U.S.C. 154(b) by 0 days.

(21) Appl. No.: 10/242,762

(22) Filed: Sep. 13, 2002

(65) Prior Publication Data

US 2003/0118872 A1 Jun. 26, 2003

Related U.S. Application Data

(60) Provisional application No. 60/391,972, filed on Jun. 28, 2002.

(30) Foreign Application Priority Data

Sep. 15, 2001 (GB) .............................. 0122333

(51) Int. Cl.[7] .................... C23C 16/02; C23C 16/34; C23C 16/50
(52) U.S. Cl. .................. 427/579; 427/534; 427/569; 427/574; 427/255.394; 427/255.18; 427/255.21; 427/372.2; 427/397.7; 438/522; 438/792; 438/902
(58) Field of Search .......................... 427/534, 535, 427/569, 573, 574, 578, 579, 255.23, 255.28, 255.394, 255.11, 255.18, 255.21, 299, 372.2, 376.2, 397.7; 438/142, 785, 791, 792, 522, 902

(56) References Cited

U.S. PATENT DOCUMENTS

| | | | | |
|---|---|---|---|---|
| 4,532,695 A | * | 8/1985 | Schuermeyer | 438/285 |
| 4,558,509 A | * | 12/1985 | Tiwari | 438/168 |
| 4,602,965 A | * | 7/1986 | McNally | 438/520 |
| 4,692,344 A | | 9/1987 | Kaganowicz et al. | |
| 4,701,343 A | * | 10/1987 | Ovshinsky et al. | 427/575 |
| 4,743,569 A | * | 5/1988 | Plumton et al. | 438/522 |
| 4,932,033 A | * | 6/1990 | Miyazawa et al. | 372/46 |
| 4,975,382 A | * | 12/1990 | Takasugi | 438/183 |
| 5,264,724 A | * | 11/1993 | Brown et al. | 257/347 |
| 5,300,460 A | * | 4/1994 | Collins et al. | 438/712 |
| 5,306,662 A | * | 4/1994 | Nakamura et al. | 438/509 |
| 5,306,946 A | * | 4/1994 | Yamamoto | 257/640 |
| 5,328,861 A | * | 7/1994 | Miyakawa | 438/151 |
| 5,384,269 A | * | 1/1995 | Cho | 438/522 |
| 5,399,900 A | * | 3/1995 | Ko et al. | 257/607 |
| 5,582,880 A | * | 12/1996 | Mochizuki et al. | 427/569 |
| 5,707,746 A | * | 1/1998 | Yaoi et al. | 428/448 |
| 5,759,916 A | * | 6/1998 | Hsu et al. | 438/636 |
| 6,083,781 A | * | 7/2000 | Zolper et al. | 438/167 |
| 6,140,215 A | * | 10/2000 | Foster et al. | 438/580 |
| 6,362,507 B1 | * | 3/2002 | Ogawa et al. | 257/350 |
| 6,391,803 B1 | * | 5/2002 | Kim et al. | 438/787 |
| 2001/0036754 A1 | * | 11/2001 | Maeda et al. | 438/787 |

FOREIGN PATENT DOCUMENTS

| | | |
|---|---|---|
| EP | 0 334 791 A1 | 9/1989 |
| JP | 58-148548 | 9/1983 |
| JP | 2-96336 | 4/1990 |

* cited by examiner

Primary Examiner—Timothy Meeks
Assistant Examiner—Wesley D. Markham
(74) Attorney, Agent, or Firm—Volentine Francos & Whitt, PLLC

(57) ABSTRACT

A silicon nitride film, for example, is deposited by introducing into a plasma region of a chamber a silicon containing gas, molecular nitrogen and sufficient hydrogen to dissociate the nitrogen to allow the silicon and nitrogen to react to form a silicon nitride film on a surface adjacent the plasma region. The thus deposited film may then be subjected to an activation anneal.

28 Claims, 4 Drawing Sheets

METHODS OF FORMING NITRIDE FILMS

CROSS-REFERENCE TO RELATED APPLICATION(S)

A claim of priority is made to U.S. provisional application Ser. No. 60/391,972, filed Jun. 28, 2002, and to British patent application no. 0122333.8, filed Sep. 15, 2001.

BACKGROUND OF THE INVENTION

1. Field of the Invention

This invention relates to a method of forming nitride films and in particular, but not exclusively, to the formation of silicon nitride films.

2. Description of the Related Art

The use of a thin film of various materials is ever expanding and in many applications it is becoming more common to provide stacks of films of different materials. Often such stacks require annealing, at some stage in the process, and this can result in blistering due to outgassing from lower layers and to cracking due to stress within the film.

One particular example of this occurs in the deposition of silicon nitride on a gallium arsenide substrate, for example as used in the production of GaAs field effect transistors, where dopant implantation of the GaAs substrate requires a subsequent high temperature anneal process to repair crystal lattice damage and "activate" the implant. This anneal, which is typically at 700° C. or more (although temperatures as low as 650° C. have been used), tends to cause out-diffusion of arsenic from the gallium arsenide substrate and thus requires a capping layer with good barrier properties and adhesion and crack resistance, especially at elevated temperatures. Typically silicon nitride is used. If the capping layer is to be simply sacrificial, it would typically have a thickness of less than 200 nm, but where it is going to have a functional property, e.g. as a dielectric layer, layers of 400 nm thickness or greater are known.

Current standard deposition processes result in blistering and, with the thicker films, cracking.

SUMMARY OF THE INVENTION

The Applicants have developed a method of forming a silicon nitride film which is less susceptible to cracking and, in certain embodiments at least, they can also deal with the problem of blistering.

From one aspect the invention consists in a method of depositing a silicon nitride film including introducing into a plasma region of a chamber a silicon-containing gas, molecular nitrogen and sufficient hydrogen to disassociate the nitrogen to allow the silicon and nitrogen to react to form a silicon nitride on a surface adjacent the plasma region.

This is in contrast to the normal approach which is to use ammonia ($NH_3$) as a source of nitrogen for plasma chemical vapour deposition processes. In general molecular nitrogen is disregarded as a nitrogen source as the triple bonding of the nitrogen gas makes it unusually stable and difficult to dissociate. Indeed it is considered so un-reactive in conventional low temperature (less than 450° C.) plasma processes but it is in widespread use as an inert dilutant in silane/ammonia processes.

What the applicants have found is that in the presence of hydrogen and in particular molecular hydrogen, the molecular nitrogen can be dissociated even at relatively low power and temperature plasma processing enabling a silicon nitride film to be formed.

As will be demonstrated below, this has significant benefits from the point of view of film stress and hence cracking.

Preferably the silicon-containing gas is silane and it has been discovered that acceptable deposition rates can be achieved with very low silane flow rates. For example the silane flow rate may be less than 10 sccm and indeed may preferably be about 2 sccm.

Surprisingly, also, it is preferred that the flow rate of molecular nitrogen is greater than the flow rate of hydrogen. i.e. there is significantly less hydrogen present, relative to the amount of nitrogen, than occurs in ammonia. In particular embodiments, the flow rate of nitrogen may be between 700 and 900 sccm and the flow rate of hydrogen may be between 500 and 800 sccm.

The plasma in the plasma region may be a high frequency (e.g. 13.56 MHz) plasma and the power supply to the plasma may be low e.g. between 50 and 150 W.

The method may further include cleaning of the surface using a $H_2$ plasma. This cleaning step should not be so aggressive as to significantly change the structure of the surface. As will be demonstrated below, the use of this treatment can remove blistering.

From another aspect the invention consists in a method of forming a nitride film including introducing into a plasma region of the chamber the source of an element to be nitrided, molecular nitrogen and sufficient hydrogen to dissociate the nitrogen to allow the element and the nitrogen to react to form a nitride film on a surface adjacent the plasma region.

Preferably the element is a metal such as a transition metal.

From a still further aspect the invention consists in a silicon nitride film having reduced Si—H and N—H bonding, particularly as shown by FTIR bonding peak area analysis. Thus the Si—H:Si—N bonding peak area ratio may be <0.02, whilst the N—H:Si—N bonding peak area ratio may be <0.007. The invention also 10 includes a gallium arsenide field effect transistor including a silicon nitride film deposited in accordance with a method as described above or including a film as defined above.

BRIEF DESCRIPTION OF THE DRAWINGS

Although the invention has been defined above, it is to be understood that it includes any inventive combination of the features set out above or in the following description. The invention may be performed in various ways, which will now be described, by way of example with reference to the accompanying figures, in which.

DETAILED DESCRIPTION OF THE PREFERRED EMBODIMENTS

The applicants wish to deposit stochiometric silicon nitride on gallium arsenide for the reasons already described. The presence of stochiometric silicon nitride is generally indicated by a refractive index of 2. The applicants are seeking, therefore, an acceptable film having such a refractive index and good (e.g. across the wafer) uniformity.

The applicants began their experiments with a standard silicon nitride capping process as defined in Table 1 below and this resulted in a film having the properties shown in Table 2 below.

TABLE 1

Prior art high frequency process (Process A)

| Silane sccm | Nitrogen Sccm | Ammonia Sccm | Pressure mTorr | Platen Temperature | Showerhead Temperature | RF Power | Frequency |
|---|---|---|---|---|---|---|---|
| 300 | 3500 | 700 | 850 | 300° C. | 300° C. | 100 W | 13.56 MHz |

TABLE 2

Process A film properties (150 mm substrates)

| Thickness Uniformity (%) | Refractive Index | Wet Etch Rate 10:1 BHF | Wet Etch Rate post 700° anneal | Stress as Deposited Dynes/cm$^2$ | Stress after 700° Anneal Dynes/cm$^2$ | Stress Change Dynes/cm$^2$ |
|---|---|---|---|---|---|---|
| <2% | 1.999 | 34 nm/min | 3 nm/min | −7E8 Compr. | +8E9 Tensile | 8.7E9 |

Figure 1:
FIG. 1 is a micrograph of an annealed silicon layer deposited on a gallium arsenide layer.
Figure 2:
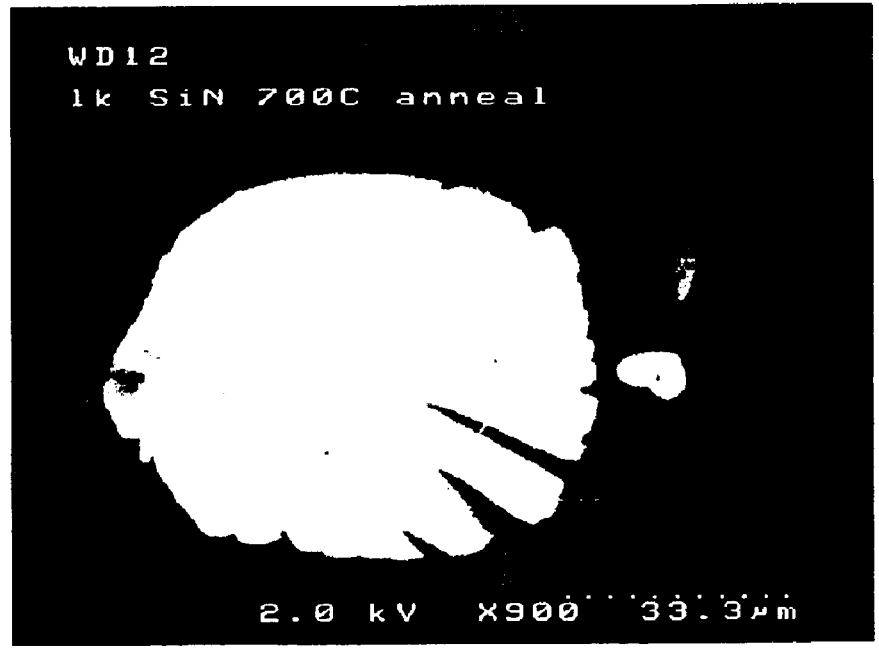
FIG. 2 is a corresponding image for the same process but for a thinner film.

FIGS. 1 and 2 show micrographs of these films at 400 nm and 100 nm thickness respectively after a 700° C. anneal. As can be seen both films show severe blistering and the thick film additionally showed cracking.

Figure 3:
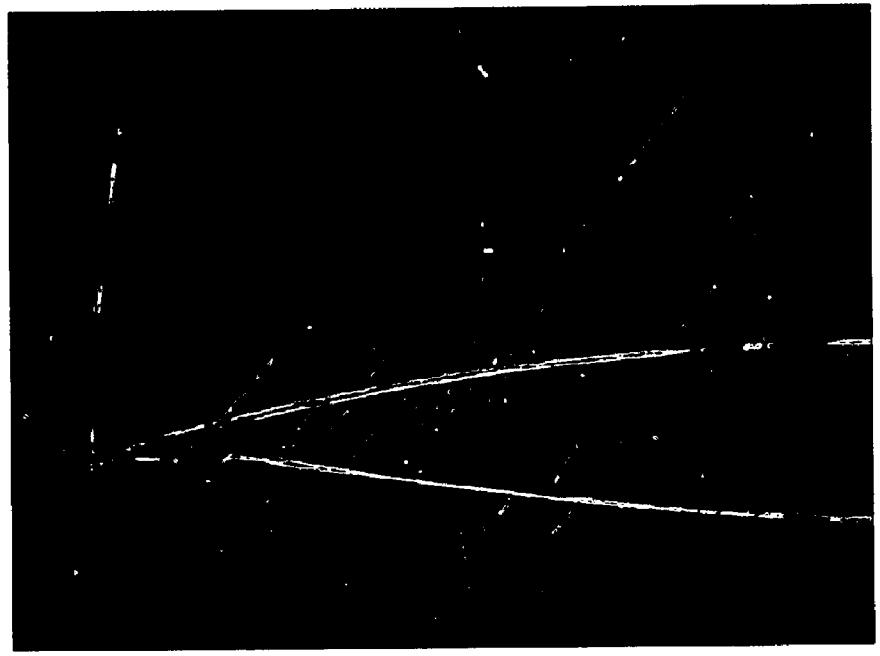
FIG. 3 is a corresponding image to FIG. 1, but where the gallium arsenide film was pre-cleaned.

The applicants hypothesised that the blistering was caused by poor adhesion of the deposited film onto the surface of the gallium arsenide presumably due to formation of a native gallium oxide prior to deposition of the silicon nitride anneal cap. They therefore pre-cleaned that surface using a high frequency hydrogen plasma and re-performed the experiments. The result is shown in FIG. 3 and it will be noted that the blistering has been successfully removed, although the cracking is still present.

It is known that plasma treatments of this type can change surface resistivity and even chrystallographic structure. It is therefore important that the pre-clean is minimised to the level that is necessary to avoid blistering. The level of cleaning required will vary with circumstances and can be derived experimentally.

Film cracking is normally associated with films that show tensile stress. While the prior art process A shown in Tables 1 and 2 show compressive stress as deposited, the film became highly tensile after anneal at 700° C. Further experiments were therefore carried out with an alternative prior art process, (process B) which was known to produce highly compressive films. The process and the resultant film characteristics are shown in Tables 3 and 4 below.

TABLE 3

Prior art low frequency process (Process B)

| Silane sccm | Nitrogen Sccm | Ammonia Sccm | Pressure mTorr | Platen Temperature | Showerhead Temperature | RF Power | Frequency |
|---|---|---|---|---|---|---|---|
| 300 | 3500 | 700 | 850 | 300° C. | 300° C. | 500 W | 380 kHz |

TABLE 4

Process B film properties (150 mm substrates)

| Thickness Uniformity (%) | Refractive Index | Wet Etch Rate 10:1 BHF | Wet Etch Rate post 700° anneal | Stress as Deposited Dynes/cm$^2$ | Stress after 700° Anneal Dynes/cm$^2$ | Stress Change Dynes/cm$^2$ |
|---|---|---|---|---|---|---|
| <2% | 2.001 | 11 nm/min | 2.8 nm/min | −5E9 Compr. | +2.2E9 Tensile | 7.2E9 |

Figure 4:
FIG. 4 is an equivalent image to FIG. 3, but for an alternative deposition process.

As can be seen although the as deposited stress is significantly more compressive than for process A, the stress change, under anneal, is of a similar order of magnitude to that that occurred with process A and the annealed film is a tensile film. Unsurprisingly, therefore, cracking was once more revealed as can be seen in FIG. 4.

Figure 5:
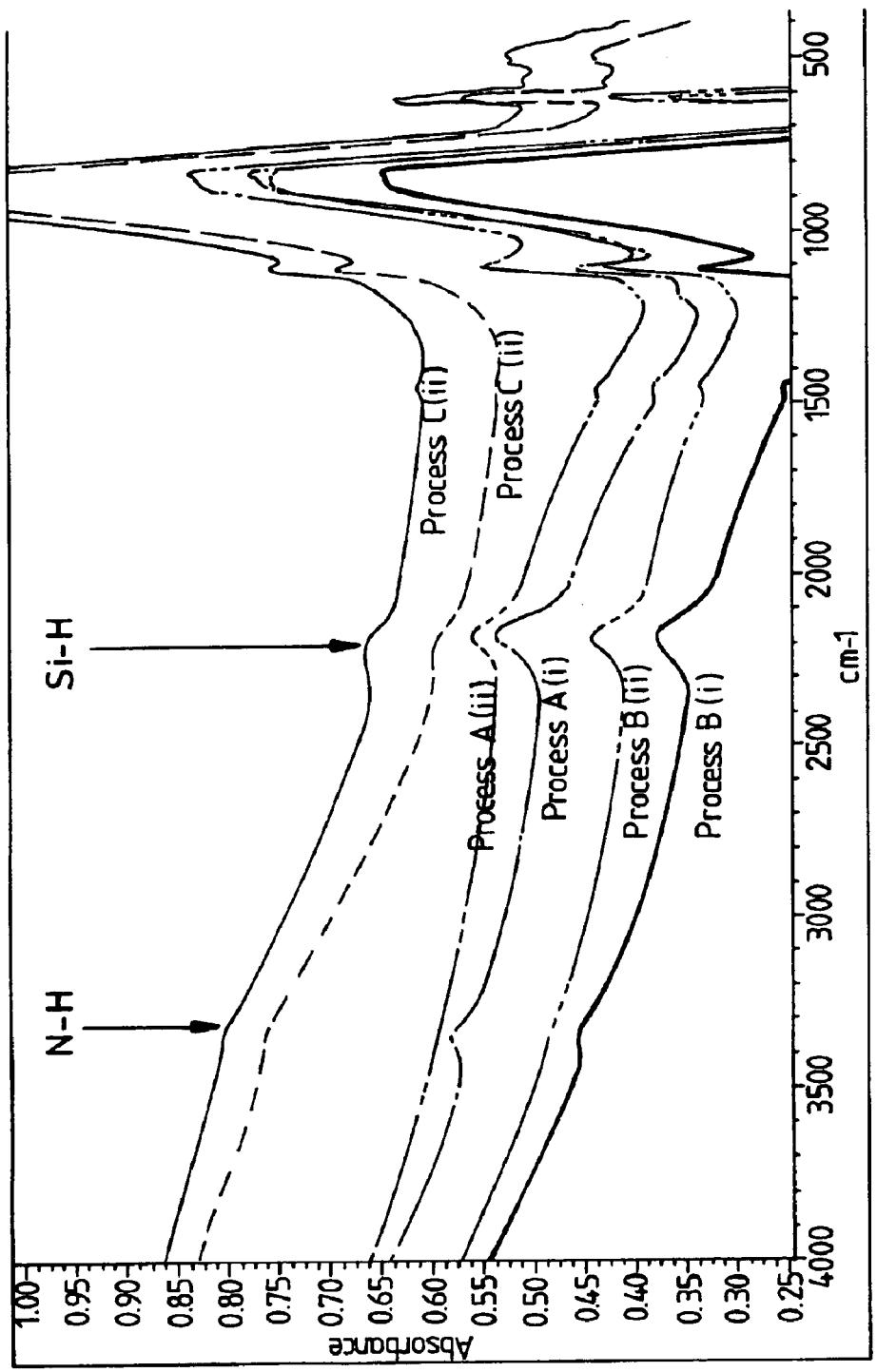
FIG. 5 is a FTIR spectra for the films of the various processes described below.

This significant level of stress change led the applicants to consider whether it was the result of change in film bonding and/or outgassing taking place during the anneal. As can be seen from FIG. 5, FTIR analysis of the processes before and after anneal showed significant changes in the hydrogen bonding after the anneal process.

From the FTIR graphs for process A and B the applicants deduced that a reduction in N—H and Si—H bonds appeared to reduce stress, and they therefore sought to find a process that would achieve this.

Figure 6:
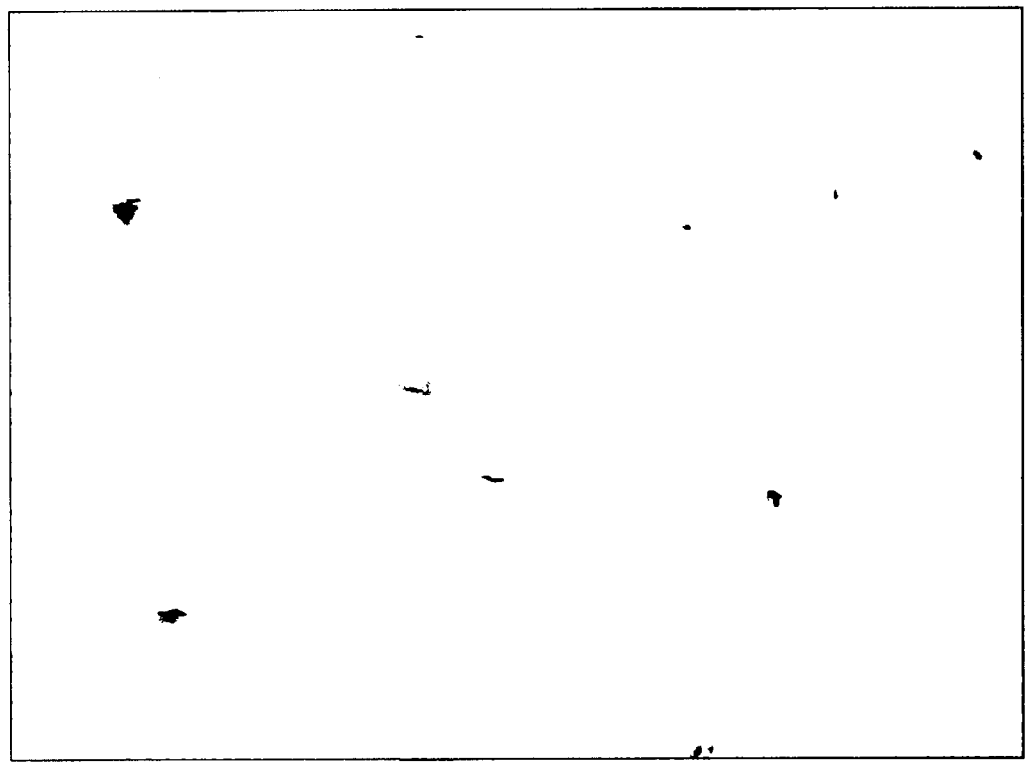
FIG. 6 is a micrograph of an annealed silicon nitride film deposited in accordance with the invention.

Further, the applicants appreciate that, surprisingly, what was important in determining whether or not a film cracked, was not its overall level of tensile stress, but rather the degree of change in stress during the anneal process. Further they postulated that this change in stress was associated with the degree of hydrogen loss during anneal. They therefore sought a different way of forming a silicon nitride (i.e. other than using the atomic nitrogen available in ammonia) and discovered that it was possible to perform a suitable reaction using silane and molecular nitrogen provided that molecular hydrogen was present to enable the molecular nitrogen to dissociate and react. The preferred experimental process is set out in Table 5 below and the resultant film is illustrated in Table 6. FIG. 6 shows the resultant micrograph and it will be seen that there are no cracks or blisters. Small dark areas visible are surface particles added to enable focussing of the optical microscope. Previously the cracks have been there to assist in focussing. It will be understood that $H_2$ pre-clean had taken place.

60% of that of the prior art process A. It may be therefore that the molecular hydrogen is also promoting dissociation of the silane.

Table 7 below shows the result of film shrinkage measurements.

TABLE 7

Film Shrinkage Information

| | Thickness before anneal | Thickness after 700° C. anneal | Shrinkage % |
|---|---|---|---|
| Process A | 385.3 nm | 370.8 nm | 3.8 |
| Process B | 440.1 nm | 426.9 nm | 3.0 |
| Process C | 499.0 nm | 493.6 nm | 1.1 |

As can be seen process C provides a film with significantly less shrinkage (e.g., less than 2%, and as shown, even less than 1.2%) after implant anneal, indicating a greater stability of the film during the high temperature processing.

It will also be noted, from the previous tables that the films of processes A and B have wet etch rates that drop dramatically after an anneal process. This is generally an indication of densification, which is consistent with a loss of hydrogen and more generally a structural change in the film. This might be regarded as desirable, if it were not for cracking. In contrast there is little change in the wet etch rate for process C indicating the film has little structural change during anneal.

Thus the use of molecular nitrogen to form the nitride by the use of hydrogen, for example molecular hydrogen, has enabled the production of a film which is thermally stable.

TABLE 5

Process C of the invention

| Silane sccm | Nitrogen Sccm | Hydrogen Sccm | Pressure mTorr | Platen Temperature | Showerhead Temperature | RF Power | Frequency |
|---|---|---|---|---|---|---|---|
| 2 | 800 | 600 | 700 | 300° C. | 300° C. | 55 W | 13.56 MHz |

TABLE 6

Process C Film Properties (150 mm substrates)

| Thickness Uniformity (%) | Refractive Index | Wet Etch Rate 10:1 BHF | Wet Etch Rate post 700° anneal | Stress as Deposited Dynes/cm$^2$ | Stress after 700° Anneal Dynes/cm$^2$ | Stress Change Dynes/cm$^2$ |
|---|---|---|---|---|---|---|
| <2% | 2.012 | 8 nm/min | 10.6 nm/min | +1E9 Tensile | +3E9 Tensile | 2E9 |

Table 6 shows that the change in stress during anneal was significantly reduced (e.g., less than 5E9, and as shown, even less than 3E9) and confirms that even though the deposited film was tensile, cracking has been avoided. Other interesting characteristics of the process are that the temperatures are low (i.e. below 450° C.), the silane flow rate is extremely low and the proportion of hydrogen to nitrogen is significantly below that that occurs in ammonia.

In addition, the use of a pre-clean step, enables the applicants to remove blistering.

Tables 8 and 9 below provide a more detailed picture of the bonding within the films. It will be seen that in the process C film the Si—N bonds are greatly increased, whilst the Si—H and N—H bonds are significantly reduced. Further the pre- and post-anneal figures for process C are much less altered than for the corresponding valves for process A and B. This is indicative of improved thermal stability.

TABLE 8

FTIR bonding peak areas pre and post anneal

|  | Si—N | Si—H | N—H |
|---|---|---|---|
| Process B as deposited | 71.420 | 4.131 | 0.687 |
| Process B Post anneal | 73.193 | 3.713 | 0.337 |
| Process A as deposited | 64.121 | 4.640 | 0.933 |
| Process A Post anneal | 73.193 | 3.713 | 0.337 |
| Process C as deposited | 102.621 | 1.222 | 0.541 |
| Process C Post Anneal | 107.257 | 1.562 | 0.697 |

TABLE 9

Ratios of FTIR bonding peak areas, pre and post anneal

|  | Si—H:Si—N | N—H:Si—N | N—H:Si—H |
|---|---|---|---|
| Process B as deposited | 0.0724 | 0.0146 | 0.2018 |
| Process B Post anneal | 0.0468 | 0.0034 | 0.0734 |
| Process A as deposited | 0.0578 | 0.0097 | 0.1663 |
| Process A Post anneal | 0.0507 | 0.0046 | 0.0908 |
| Process C as deposited | 0.0119 | 0.0053 | 0.4427 |
| Process C Post anneal | 0.0146 | 0.0065 | 0.4462 |

What is claimed is:

1. A method of depositing a silicon nitride capping layer, said method including;
    placing a gallium arsenide (GaAs) substrate which includes a non-activated implant into a chamber;
    pre-cleaning the surface of the GaAs substrate using a $H_2$ plasma; and
    introducing into a plasma region of the chamber a silicon containing gas, molecular nitrogen and sufficient hydrogen to dissociate the nitrogen to allow the silicon and nitrogen to react to form a silicon nitride capping layer of at least 400 nanometers in thickness on a surface of the GaAs substrate which includes the non-activated implant adjacent the plasma region,
    wherein a flow rate of the nitrogen is in the range 700–900 sccm and a flow rate of the hydrogen is 500–800 sccm, and
    wherein a power supplied to the plasma is between 50 and 150 W.

2. The method as claimed in claim 1 wherein the silicon containing gas is silane.

3. The method as claimed in claim 2 wherein a flow rate of the silane is less than 10 sccm.

4. The method as claimed in claim 2 wherein a flow rate of the silane is about 2 sccm.

5. The method as claimed in claim 1 wherein a flow rate of the molecular nitrogen is greater than a flow rate of the hydrogen.

6. The method as claimed in claim 1 wherein the formed film has a refractive index of about 2.

7. The method as claimed in claim 1 wherein a plasma in the plasma region is a high frequency plasma.

8. A method of forming a nitride capping layer, said method including:
    placing a gallium arsenide (GaAs) substrate which includes a non-activated implant into a chamber;
    pre-cleaning the surface of the GaAs substrate using a $H_2$ plasma; and
    introducing into a plasma region of the chamber a source of an element to be nitrided, molecular nitrogen and sufficient hydrogen to dissociate the nitrogen to allow the element and the nitrogen to react to form a nitride capping layer of at least 400 nanometers in thickness on a surface of the GaAs substrate which includes the non-activated implant adjacent the plasma regions,
    wherein a flow rate of the nitrogen is in the range 700–900 sccm and a flow rate of the hydrogen is 500–800 sccm, and
    wherein a power supplied to the plasma is between 50 and 150 W.

9. The method as claimed in claim 8 wherein the element is a metal.

10. The method as claimed in claim 9 wherein the element is a transition metal.

11. The method as claimed in claim 8 wherein the formed film has a refractive index of about 2.

12. A method of depositing a stochiometric silicon nitride capping layer, said method including:
    placing a gallium arsenide (GaAs) substrate which includes a non-activated implant into a chamber;
    pre-cleaning the surface of the GaAs substrate using a $H_2$ plasma; and
    introducing into a plasma region of a the chamber a silicon containing gas, molecular nitrogen and sufficient hydrogen to dissociate the nitrogen to allow the silicon and nitrogen to react to form a stochiometric silicon nitride capping layer of at least 400 nanometers in thickness on a surface of the GaAs substrate which includes the non-activated implant adjacent the plasma region,
    wherein a flow rate of the nitrogen is in the range 700–900 sccm and a flow rate of the hydrogen is 500–800 sccm, and
    wherein a power supplied to the plasma is between 50 and 150 W.

13. The method as claimed in claim 12 wherein the silicon containing gas is silane.

14. A method as claimed in claim 13 wherein a flow rate of the silane is less than 10 sccm.

15. A method as claimed in claim 13 wherein a flow rate of the silane is about 2 sccm.

16. A method as claimed in claim 12 wherein a flow rate of the molecular nitrogen is greater than a flow rate of the hydrogen.

17. A method as claimed in claim 12 wherein the formed film has a refractive index of about 2.

18. A method of forming a stochiometric nitride capping layer, said method including:
    placing a gallium arsenide (GaAs) substrate which includes a non-activated implant into a chamber;
    pre-cleaning the surface of the GaAs substrate using a $H_2$ plasma; and
    introducing into a plasma region of the chamber a source of an element to be nitrided, molecular nitrogen and sufficient hydrogen to dissociate the nitrogen to allow the element and the nitrogen to react to form the stochiometric nitride capping layer of at least 400 nanometers in thickness on a surface of the GaAs substrate which includes the non-activated implant adjacent the plasma region, wherein a flow rate of the nitrogen is in the range 700–900 sccm and a flow rate of the hydrogen is 500–800 sccm, and wherein a power supplied to the plasma is between 50 and 150 W.

19. A method as claimed in claim 18 wherein the element is a metal.

20. A method as claimed in claim 18 wherein the element is a transition metal.

21. A method of depositing a silicon nitride capping layer, said method including:

placing a gallium arsenide (GaAs) substrate which includes a non-activated implant into a chamber;

pre-cleaning the surface of the GaAs substrate using a H$_2$ plasma; and introducing into a plasma region of the chamber a silicon containing gas, molecular nitrogen and sufficient hydrogen to dissociate the nitrogen to allow the silicon and nitrogen to react to form a silicon nitride capping layer of at least 400 nanometers in thickness on a surface of the GaAs substrate which includes the non-activated implant adjacent the plasma region, wherein a flow rate of the nitrogen is in the range 700–900 sccm and a flow rate of the hydrogen is 500–800 sccm, and wherein a power supplied to the plasma is between 50 and 150 W; and then annealing the GaAs substrate to activate the implant contained therein, wherein the silicon nitride capping layer inhibits diffusion of arsenic from the GaAs substrate during said annealing.

22. The method as claimed in claim 21 wherein the annealing is at about 700° C.

23. The method as claimed in claim 21 wherein the silicon nitride capping layer is formed as a stochiometric film.

24. The method as claimed in claim 21 wherein a temperature of the annealing is at least 650° C.

25. A method of forming a nitride capping layer, said method including:

placing a gallium arsenide (GaAs) substrate which includes a non-activated implant into a chamber;

pre-cleaning the surface of the GaAs substrate using a H$_2$ plasma; and introducing into a plasma region of the chamber a source of an element to be nitrided, molecular nitrogen and sufficient hydrogen to dissociate the nitrogen to allow the element and the nitrogen to react to form the nitride film of at least 400 nanometers in thickness on a surface adjacent the plasma region, wherein a flow rate of the nitrogen is in the range 700–900 sccm and a flow rate of the hydrogen is 500–800 sccm, and wherein a power supplied to the plasma is between 50 and 150 W; and then annealing the GaAs substrate to activate the implant contained therein, wherein the nitride capping layer inhibits diffusion of arsenic from the GaAs substrate during said annealing.

26. The method as claimed in claim 25 wherein the annealing is at about 700° C.

27. The method as claimed in claim 25 wherein the nitride capping layer is formed as a stochiometric film.

28. The method as claimed in claim 25 wherein a temperature of the annealing is at least 650° C.

* * * * *